(12) United States Patent
Kanomata

(10) Patent No.: US 10,553,913 B2
(45) Date of Patent: Feb. 4, 2020

(54) BATTERY APPARATUS, CHARGING CONTROL APPARATUS, AND CHARGING CONTROL METHOD

(71) Applicant: Murata Manufacturing Co., Ltd., Kyoto (JP)

(72) Inventor: Hiroto Kanomata, Fukushima (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/538,272

(22) PCT Filed: Dec. 2, 2015

(86) PCT No.: PCT/JP2015/005989
§ 371 (c)(1),
(2) Date: Jun. 21, 2017

(87) PCT Pub. No.: WO2016/113791
PCT Pub. Date: Jul. 21, 2016

(65) Prior Publication Data
US 2017/0352926 A1 Dec. 7, 2017

(30) Foreign Application Priority Data
Jan. 16, 2015 (JP) ................................. 2015-007214

(51) Int. Cl.
*H01M 10/44* (2006.01)
*G01R 31/3842* (2019.01)
(Continued)

(52) U.S. Cl.
CPC ........ *H01M 10/44* (2013.01); *G01R 31/3842* (2019.01); *H01M 10/42* (2013.01);
(Continued)

(58) Field of Classification Search
CPC ............................. H02J 7/0047; H01M 10/44
(Continued)

(56) References Cited

U.S. PATENT DOCUMENTS 3,517,293 A 6/1970 Burkett et al.
2011/0156661 A1* 6/2011 Mehta ................... H02J 7/0073
320/160

(Continued)

FOREIGN PATENT DOCUMENTS

CN 103001299 A 3/2013
EP 2568569 A2 3/2013
(Continued)

OTHER PUBLICATIONS

Machine Translation of JP2002-135990A.*
(Continued)

*Primary Examiner* — David V Henze-Gongola
(74) *Attorney, Agent, or Firm* — Chip Law Group

(57) ABSTRACT

A control is performed to set a current value exceeding a nominal capacity of the secondary battery to first charging current to charge the secondary battery, compare the measured voltage of the secondary battery with first threshold voltage that is lower than a prescribed charging voltage while performing constant current charging with the set first charging current, decrease the first charging current to be second charging current when the measured voltage is higher than the first threshold voltage, and increase the first threshold voltage by a predetermined amount to be second threshold voltage, compare the measured voltage of the secondary battery with the second threshold voltage that is lower than the prescribed charging voltage while performing constant current charging with the set second charging current, decrease the second charging current to be third charging current when the measured voltage is higher than (Continued)

the second threshold voltage, and increase the second threshold voltage by a predetermined amount to be third threshold voltage, repeat a comparison of the measured voltage with the threshold voltage and a change of the charging current and a change of the threshold voltage, and complete rapid charging in a case where $n^{th}$ charging current is decreased to a predetermined value and the measured voltage is higher than the predetermined value.

10 Claims, 8 Drawing Sheets

(51) Int. Cl.
　　*H01M 10/42*　　　(2006.01)
　　*H02J 7/00*　　　　(2006.01)
(52) U.S. Cl.
　　CPC ............ *H02J 7/007* (2013.01); *H02J 7/0047* (2013.01); *H01M 2010/4271* (2013.01); *H02J 2007/0049* (2013.01)
(58) Field of Classification Search
　　USPC ........................................................ 320/160
　　See application file for complete search history.

(56) References Cited

U.S. PATENT DOCUMENTS

| | | | | |
|---|---|---|---|---|
| 2012/0025771 A1* | 2/2012 | Bhardwaj | ............... | H02J 7/047 320/128 |
| 2013/0063079 A1* | 3/2013 | Kawai | .................... | H02J 7/045 320/107 |

FOREIGN PATENT DOCUMENTS

| | | | | |
|---|---|---|---|---|
| JP | 48-26513 | A | | 4/1973 |
| JP | 48-026513 | A | | 4/1973 |
| JP | 48-26513 | B1 | | 8/1973 |
| JP | 06-121468 | A | | 4/1994 |
| JP | 07-296853 | A | | 11/1995 |
| JP | 09-331636 | A | | 12/1997 |
| JP | 11-97074 | A | | 4/1999 |
| JP | 2002-135990 | A | | 5/2002 |
| JP | 2002135990 | A | * | 5/2002 |
| JP | 2002135990 | A | * | 5/2002 |
| JP | 2005-192383 | A | | 7/2005 |
| JP | 2008-035674 | A | | 2/2008 |
| JP | 2010-207074 | A | | 9/2010 |
| JP | 2011-211846 | A | | 10/2011 |
| JP | 2013-013258 | A | | 1/2013 |
| JP | 2013-051819 | A | | 3/2013 |
| JP | 2013-62905 | A | | 4/2013 |
| JP | 2013-062905 | A | | 4/2013 |

OTHER PUBLICATIONS

Machine Translation of JP2002-135990A. (Year: 2002).*
International Search Report and Written Opinion of PCT Application No. PCT/JP2015/005989, dated Feb. 16, 2016, 01 pages of English Translation and 05 pages of ISRWO.
Office Action for JP Patent Application No. 2016-569128, dated May 16, 2018, 04 pages of Office Action and 03 pages of English Translation.
Office Action for JP Patent Application No. 2016-569128, dated Dec. 11, 2018, 04 pages of Office Action and 03 pages of English Translation.
Office Action for JP Patent Application No. 2016-569128, dated Sep. 11, 2018, 05 pages of Office Action and 04 pages of English Translation.

* cited by examiner

BATTERY APPARATUS, CHARGING CONTROL APPARATUS, AND CHARGING CONTROL METHOD

CROSS REFERENCE TO RELATED APPLICATIONS

This application is a U.S. National Phase of International Patent Application No. PCT/JP2015/005989 filed on Dec. 2, 2015, which claims priority benefit of Japanese Patent Application No. JP 2015-007214 filed in the Japan Patent Office on Jan. 16, 2015. Each of the above-referenced applications is hereby incorporated herein by reference in its entirety.

TECHNICAL FIELD

The present disclosure relates to a battery apparatus that can rapidly charge, for example, a lithium ion secondary battery, to a charging control apparatus, and to a charging control method.

BACKGROUND ART

A lithium ion secondary battery is widely used as a power source of, for example, a smartphone. Users of the smartphone demand rapid charging capable of charging a battery for a short time. For the rapid charging, large current charging is necessary. The capacity degradation caused by the large current charging is concerned during the course of cycling. In the past, a rapid charging apparatus has been proposed as described in Patent Literature 1 to Patent Literature 4 below.

In Patent Literature 1, in order to solve the problem that cycle characteristics are degraded in a case where charging current is increased and charging is performed under a high temperature atmosphere for the rapid charging, the following processes are repeated. Specifically, constant current charging is performed at a first stage with large current, the charging current is decreased immediately after it reaches prescribed charging voltage, and charging is performed at a second stage with the decreased current.

Patent Literature 2 describes that charging is performed with charging current exceeding the nominal capacity of a lithium ion secondary battery, is performed to half of a maximum charging capacity, and is then performed with rated charging current. As long as the charging is performed to half of the maximum charging capacity, cycle characteristics are not significantly degraded.

Patent Literature 3 describes that, similar to Patent Literature 1, the control is performed such that the charging current is decreased when the measured voltage reaches near the charging voltage prescribed by the secondary battery.

Patent Literature 4 relates to a configuration of a charging apparatus including a combination of a power source control circuit at a first side and a charging control circuit at a second side. In order to downsize the charging apparatus, an object is to control charging voltage and charging current even when the number of parts is reduced from the circuit configuration in the related art. By incorporating different charging control manners into the first side and the second side, it is possible to similarly control the charging before the number of parts is reduced.

[Patent Literature 1] Japanese Patent Application Laid-open No. 7-296853

[Patent Literature 2] Japanese Patent Application Laid-open No. 2002-135990

[Patent Literature 3] Japanese Patent Application Laid-open No. 2013-13258

[Patent Literature 4] Japanese Patent Application Laid-open No. 2013-51819

DISCLOSURE OF INVENTION

Technical Problem

In the charging control methods described in Patent Literature 1 and Patent Literature 3, the state of the secondary battery close to the prescribed charging voltage lasts long, and cycle characteristics may be noticeably degraded (in other words, the capacity is degraded during the course of cycling. Further, in Patent Literature 3, the control is performed such that the charging current is gradually increased in accordance with the battery voltage measured at the time of starting the charging. Therefore, in a case where the rapid charging is targeted, a time loss occurs until the charging current reaches an upper limit.

In Patent Literature 2, charging capacity of the secondary battery exceeds half of the maximum charging capacity at the time of starting the charging, which shifts to a second charging control at low charging current, and no rapid charging can be performed.

Patent Literature 4 describes that charging is shifter to constant voltage charging at certain threshold voltage. In addition, the charging current is moderately decreased in Patent Literature 4. As a result of such charging, rapid charging is insufficiently performed.

In view of the problems described in Patent Literatures 1 to 4, the present disclosure provides a battery apparatus that can perform rapid charging to prevent the cycle characteristics from degrading, a charging control apparatus, and a charging control method.

Solution to Problem

The present disclosure provides a battery apparatus including a secondary battery, a measurement portion that measures voltage and current of the secondary battery, and a controller, to which measured voltage and measured current are supplied from the measurement portion, that controls charging voltage and charging current of the secondary battery, the controller performing control to set a current value exceeding a nominal capacity of the secondary battery to a first charging current to charge the secondary battery, compare the measured voltage of the secondary battery with first threshold voltage that is lower than a prescribed charging voltage while performing constant current charging with the set first charging current, decrease the first charging current to be second charging current when the measured voltage is higher than the first threshold voltage, and increase the first threshold voltage by a predetermined amount to be second threshold voltage, compare the measured voltage of the secondary battery with the second threshold voltage that is lower than the prescribed charging voltage while performing constant current charging with the set second charging current, decrease the second charging current to be third charging current when the measured voltage is higher than the second threshold voltage, and increase the second threshold voltage by a predetermined amount to be third threshold voltage, and repeat a comparison of the measured voltage with the threshold voltage and a change of the charging current and the threshold voltage, and complete rapid charging in a case where $n^{th}$ charging current is decreased to a predetermined value and the measured voltage is higher than the predetermined value.

The present disclosure provides a charging control apparatus, to which measured voltage and measured current are supplied from a secondary battery to be charged, that controls charging voltage and charging current of the secondary battery, the controller performing control to set a current value exceeding a nominal capacity of the secondary battery to first charging current to charge the secondary battery, compare the measured voltage of the secondary battery with first threshold voltage that is lower than a prescribed charging voltage while performing constant current charging with the set first charging current, decrease the first charging current to be second charging current when the measured voltage is higher than the first threshold voltage, and increase the first threshold voltage by a predetermined amount to be second threshold voltage, compare the measured voltage of the secondary battery with the second threshold voltage that is lower than the prescribed charging voltage while performing constant current charging with the set second charging current, decrease the second charging current to be third charging current when the measured voltage is higher than the second threshold voltage, and increase the second threshold voltage by a predetermined amount to be third threshold voltage, repeat a comparison of the measured voltage with the threshold voltage and a change of the charging current and a change of the threshold voltage, and complete rapid charging in a case where $n^{th}$ charging current is decreased to a predetermined value and the measured voltage is higher than the predetermined value.

The present disclosure provides a charging control method that receives measured voltage and measured current of a secondary battery to be charged and controls charging voltage and charging current of the secondary battery, including performing control to set a current value exceeding a nominal capacity to first charging current in order to charge the secondary battery, compare the measured voltage of the secondary battery with first threshold voltage that is lower than a prescribed charging voltage while performing constant current charging with the set first charging current, decrease the first charging current to be second charging current when the measured voltage is higher than the first threshold voltage, and increase the first threshold voltage by a predetermined amount to be second threshold voltage, compare the measured voltage of the secondary battery with the second threshold voltage that is lower than the prescribed charging voltage while performing constant current charging with the set second charging current, decrease the second charging current to be third charging current when the measured voltage is higher than the second threshold voltage, and increase the second threshold voltage by a predetermined amount to be third threshold voltage, repeat a comparison of the measured voltage with the threshold voltage and a change of the charging current and the threshold voltage, and complete rapid charging in a case where $n^{th}$ charging current is decreased to a predetermined value and the measured voltage is higher than the predetermined value.

Advantageous Effects of Invention

According to at least one embodiment of the present disclosure, since the current value exceeding a nominal capacity of the secondary battery is set as the charging current, the rapid charging can be performed. In addition, according to the present disclosure, since the rapid charging is performed with the voltage lower than the prescribed charging voltage, the cycle characteristics are prevented from degrading. It should be noted that the effects described here are not necessarily limitative and may be any of effects described in the present disclosure.

MODE(S) FOR CARRYING OUT THE INVENTION

The embodiments to be described below are the preferred specific examples of the present invention, and various technically preferable limitations are imposed thereon. However, the scope of the present invention is not limited to these embodiments unless specifically described to limit the present invention in the following description.

The present disclosure will be described in the following order.

<1. Embodiment>
<2. Modification Examples>

1. Embodiment

Battery Pack

Figure 1:
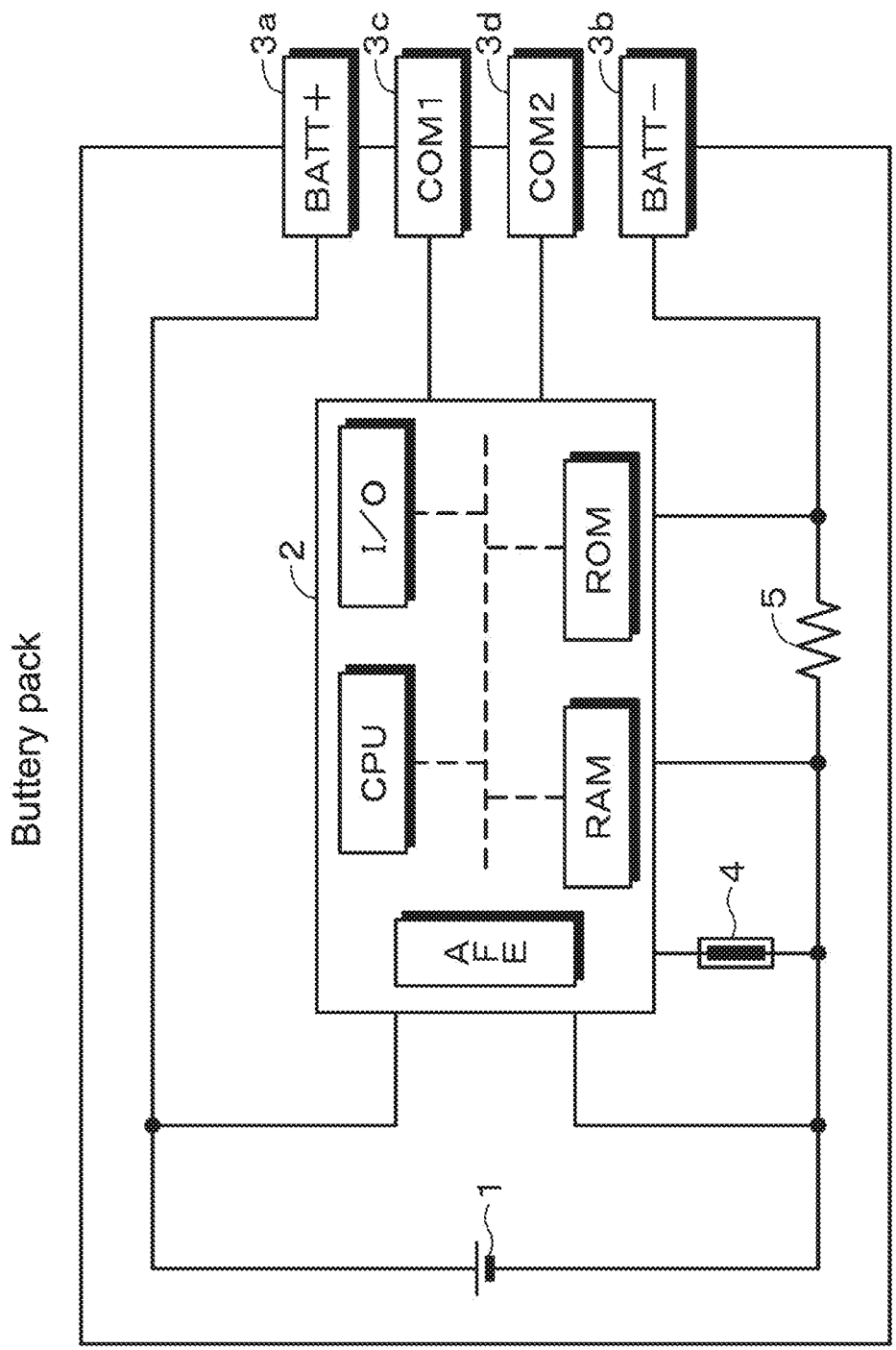
FIG. 1 is a block diagram of an embodiment according to the present disclosure.

As shown in FIG. 1, an embodiment of the present disclosure is a battery pack, to which the present disclosure is applied, where a battery cell 1 of a secondary battery, a controller 2, and associated devices are housed in the same housing (case). The battery cell 1 is a lithium ion secondary battery, for example. Prescribed charging voltage of the battery cell 1 is set to 4.35 V, for example.

The battery pack includes connectors 3a, 3b, 3c, and 3d for external connection. The connector 3a is connected to a positive electrode of the battery cell 1, and the connector 3b is connected to a negative electrode of the battery cell 1. The connectors 3c and 3d are terminals for communication between the controller 2 with an external device.

For example, the controller 2 that controls the battery pack is a microcomputer including a CPU (Central Processing Unit), a RAM (Random Access Memory), a ROM (Read Only Memory), an I/O (Input/Output), an AFE (Analog Front End), and the like. The AFE is an analog circuit arranged between an analog signal unit and the CPU of the controller 2. Note that the battery pack may include a switching device that turns on/off charging current and a switching device that turns on/off discharging current. These switching devices may be controlled by the controller 2.

The voltage of the battery cell 1 is supplied to the controller 2. Further, the temperature of the battery pack is measured by a temperature detection device, for example, a thermistor 4, and information about the measured temperature is supplied to the controller 2. Further, current flowing through a current path of the battery cell 1 is detected by a current detection resistor 5, and the detected current value is supplied to the controller 2.

Charging Control

The controller 2 controls a charging operation to the battery cell 1. The control performed by the controller 2 is shown in a flowchart of FIG. 2. Note that positive and negative output terminals of a charging apparatus are connected to the connectors 3a, 3b of the battery pack, and communication terminals of the charging apparatus are connected to the connectors 3c, 3d upon charging. The charging apparatus generates charging voltage and charging current each having a predetermined value from a commercial power source, as an example. The charging voltage and the charging current are set by communication with the controller 2 of the battery pack. As a communication method, a serial communication is used, for example.

According to the embodiment of the present disclosure, the current value exceeding a nominal capacity of the battery cell 1 is set as the charging current. As a result, rapid charging is performed. In addition, in order to suppress degradation of cycle characteristics, charging parameters are changed depending on the measurement data of the battery cell 1. The measurement data includes the number of cycles, a total operation time, a high voltage exposure time, a high temperature exposure time, a charging and discharging time, a capacity value, an internal impedance of the battery cell, and the like. The measurement data relates to the degradation of the battery cell, and is stored in a non-volatile memory of the controller 2, for example.

Figure 2:
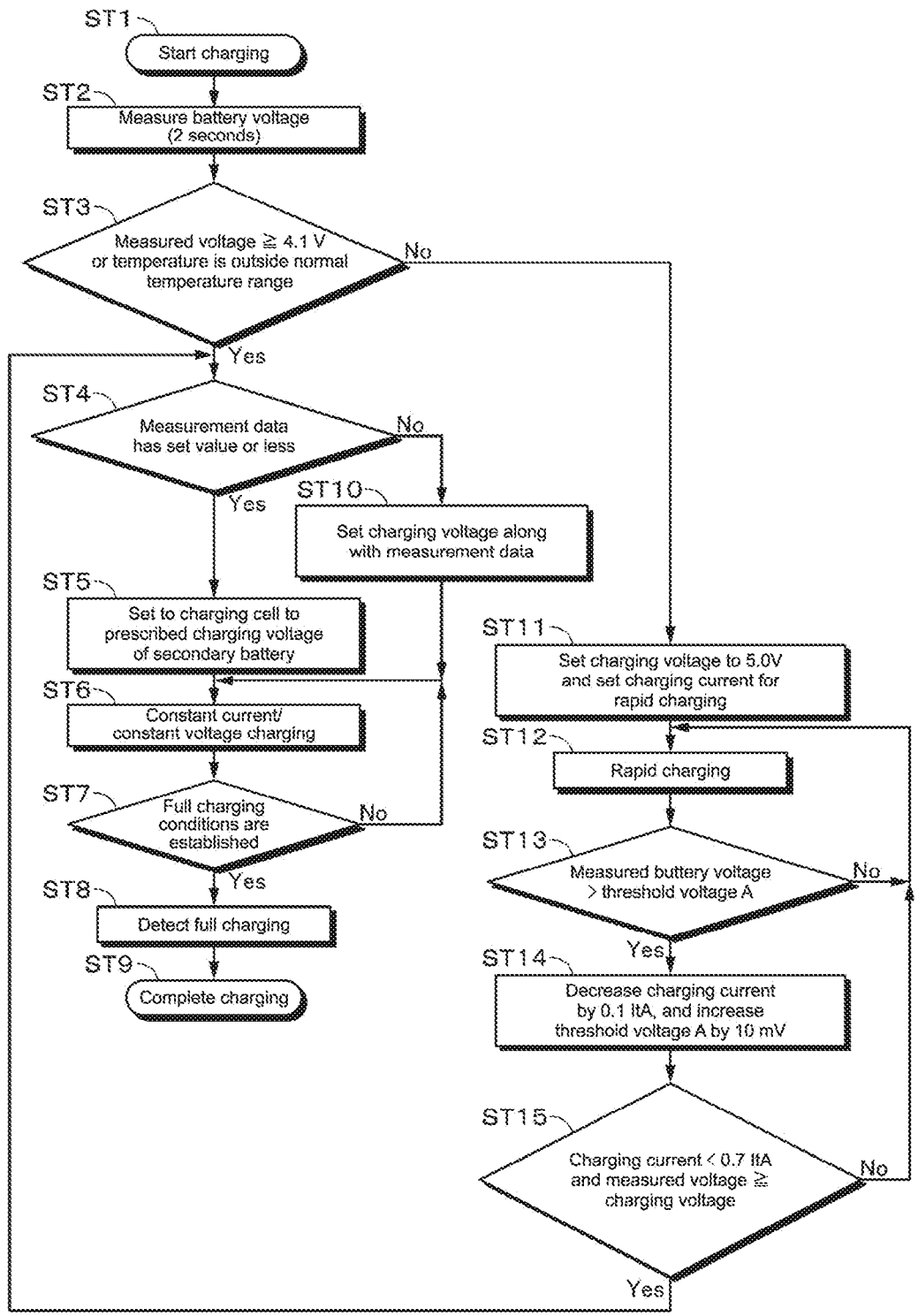
FIG. 2 is a flowchart for describing charging control of an embodiment according to the present disclosure.

With reference to the flowchart of FIG. 2, the charging control will be described.
Step ST1: Start charging
Step ST2: Measure voltage (battery voltage) of the battery cell 1. For example, the voltage is measured for 2 seconds, and an average value is used.
Step ST3: Determine whether or not the measured voltage is predetermined voltage, e.g., 4.1 V or more, or the temperature of the battery pack is outside a normal temperature range. Step ST3 is to determine whether or not the battery pack is nearly fully charged, and whether or not a temperature environment is suitable for the rapid charging.

When the measured voltage is 4.1 V or more, the battery pack is nearly fully charged, and the rapid charging according to the present disclosure is less required. Thus, normal charging is performed after Step ST4. The normal charging is constant current/constant voltage charging. Specifically, the constant current/constant voltage charging is a method of charging at constant current to predetermined voltage, and of charging at constant voltage after the battery voltage reaches the predetermined voltage. The voltage value where the constant current charging is switched to the constant voltage charging is, for example, 4.24 V. Further, in a case where the temperature of the battery pack is outside the normal temperature range, the rapid charging is not performed in order to prevent the temperature from being increased.

Step ST4: Determine whether or not the measurement data, for example, the number of cycles, has the set value or less. Step ST4 determines a degradation degree of the battery cell 1.
Step ST5: When the measurement result of Step ST4 is Yes, set the charging voltage to the prescribed charging voltage of the battery cell 1 (for example, 4.35 V).
Step ST6: Perform the constant current/constant voltage charging. For example, the prescribed charging voltage is set to 4.35 V, and the charging current is set to 0.7 ItA. Note that the current ItA is defined as (ItA=rated capacity (Ah)/1(h)), and has a value equal to 1 C.
Step ST7: Determine whether or not full charging conditions are established. The full charging conditions in the related art may be used. For example, in a case where the charging current has a predetermined value (for example, the value of 1/20 or less of the nominal capacity), it can be detected as the full charging. Note that in a case where a difference between the voltage of the battery cell 1 and the charging voltage is a predetermined value or less, it may be detected as the full charging. In a case where the full charging conditions are not established, the process returns to Step ST6 (constant current/constant voltage charging).
Step ST8: Detect the full charging when the full charging conditions are established.
Step ST9: Complete the charging operation.

Step ST10: In Step ST4, when it is determined that the measurement data does not have the set value or less, the charging voltage is set along with the measurement data. For example, the charging voltage is set to have a value smaller than that of the prescribed charging voltage. Next, the constant current/constant voltage charging in Step ST6 is performed. The following processing is similar to that as described above.

In a case where the determination result in Step ST3 described above is No, i.e., in a case where the measurement voltage is lower than 4.1 V, and the temperature of the battery pack is within the normal temperature range, the processing proceeds to Step ST11, and the rapid charging is performed by the processing after Step ST11.

Step ST11: Increase the charging voltage supplied to the connectors 3a, 3b to the prescribed charging voltage or more, for example, to +5.0 V, and set the value of the charging current for the rapid charging. The reason why the charging voltage is increased is that the charging current is suppressed from dropping upon large current charging, taking into consideration a voltage increase caused by the internal resistance of the battery cell 1 and resistance of an electronic circuit. In addition, by setting the charging current to have a large current value for the rapid charging, it aims to decrease the charging time. The current value for the rapid charging is a current value exceeding the nominal capacity of the battery cell 1, and is set, for example, to 1.8 ItA. For example, 1.8 ItA=5274 mA.
Step ST12: Perform the rapid charging with the set charging voltage and the set charging current.
Step ST13: Determine whether or not the measured battery voltage is higher than threshold voltage A during the rapid charging. In a case where the battery voltage is the threshold voltage A or less, the rapid charging in Step ST12 is continued with no change of the charging voltage and the charging current. The threshold voltage A is voltage having the value of the prescribed charging voltage or less. As an example, an initial value of the threshold voltage A is set to 4.24 V.
Step ST14: When the determined result is Yes in Step ST13, i.e., when it is determined that the battery voltage is higher than the threshold voltage A, the charging current is decreased by a predetermined amount, for example, 0.1 ItA, and the threshold voltage A is increased by a predetermined amount, 10 mV.

Step ST15: Determine whether or not the relationships of (charging current<predetermined value) and (measured voltage≥predetermined value) are established. For example, the relationships are (charging current<0.7 ItA) and (measure voltage≥charging voltage). When the conditions are established, it is determined that the battery pack is nearly fully charged, and the charging voltage is decreased from 5.0 V to the prescribed charging voltage. Thereafter, the processing returns to Step ST4 (determines whether or not the measurement data has the set value or less). After Step ST4, the constant current/constant voltage charging is performed until the full charging.

Thus, upon the rapid charging, every time the measured voltage of the secondary battery reaches the threshold voltage A (prescribed charging voltage of battery cell 1 or less) where the constant current charging is performed with the prescribed charging voltage and the prescribed charging current, the charging current is successively decreased, for example, by 0.1 ItA. Since the charging current is decreased by one step, the measured voltage is also decreased lower than the threshold voltage A. Next, when the measured voltage is lower than the threshold voltage A having the value increased by 10 mV, the charging current is decreased by 0.1 ItA. In this manner, charging is step-by-step performed while the charging current is successively decreased, which repeats reaching the threshold voltage A and dropping the voltage. This control allows the duration in which the battery cell 1 has nearly the prescribed charging voltage to be short during charging, even if charging is performed with large current. Thus, it is possible to reduce the influence of the capacity degradation during the course of cycling.

Graph of Charging Control

Figure 3:
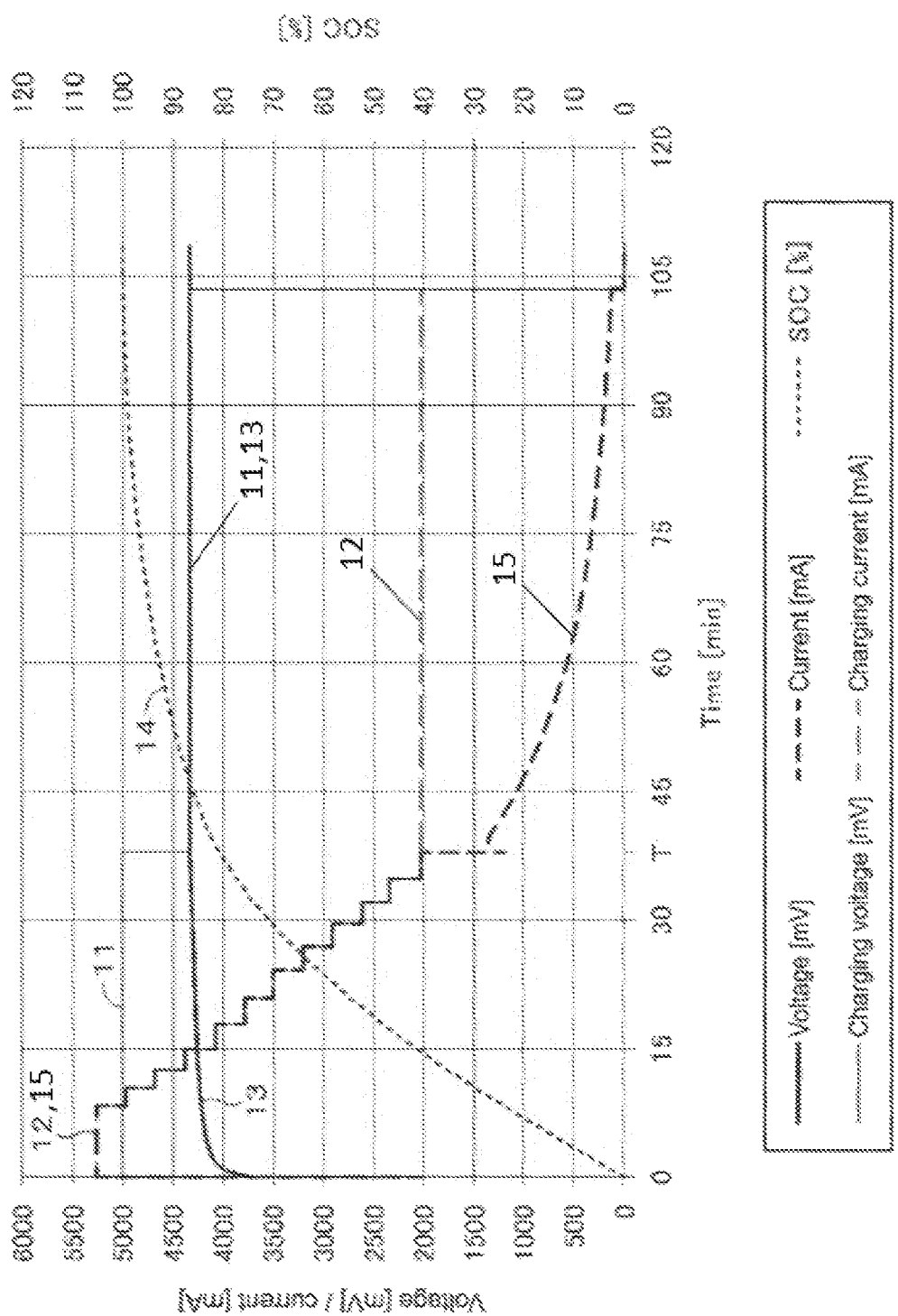
FIG. 3 is a graph for describing the charging control.

FIG. 3 is a graph showing the charging control according to an embodiment of the present disclosure. In FIG. 3, the horizontal axis represents a time passage, and the vertical axis represents voltage (mV) or current (mA) and SOC (%). At the time T of the graph, the charging is switched from the rapid charging to the constant current/constant voltage charging. Note that without switching from the rapid charging to the constant current/constant voltage charging, the rapid charging may be performed until the full charging. According to the embodiment of the present disclosure, the charging is switched from the rapid charging to the constant current/constant voltage charging. This is because the charging time may be increased only by the rapid charging in a case where the charging current is gradually decreased according to the present disclosure.

Figure 4:
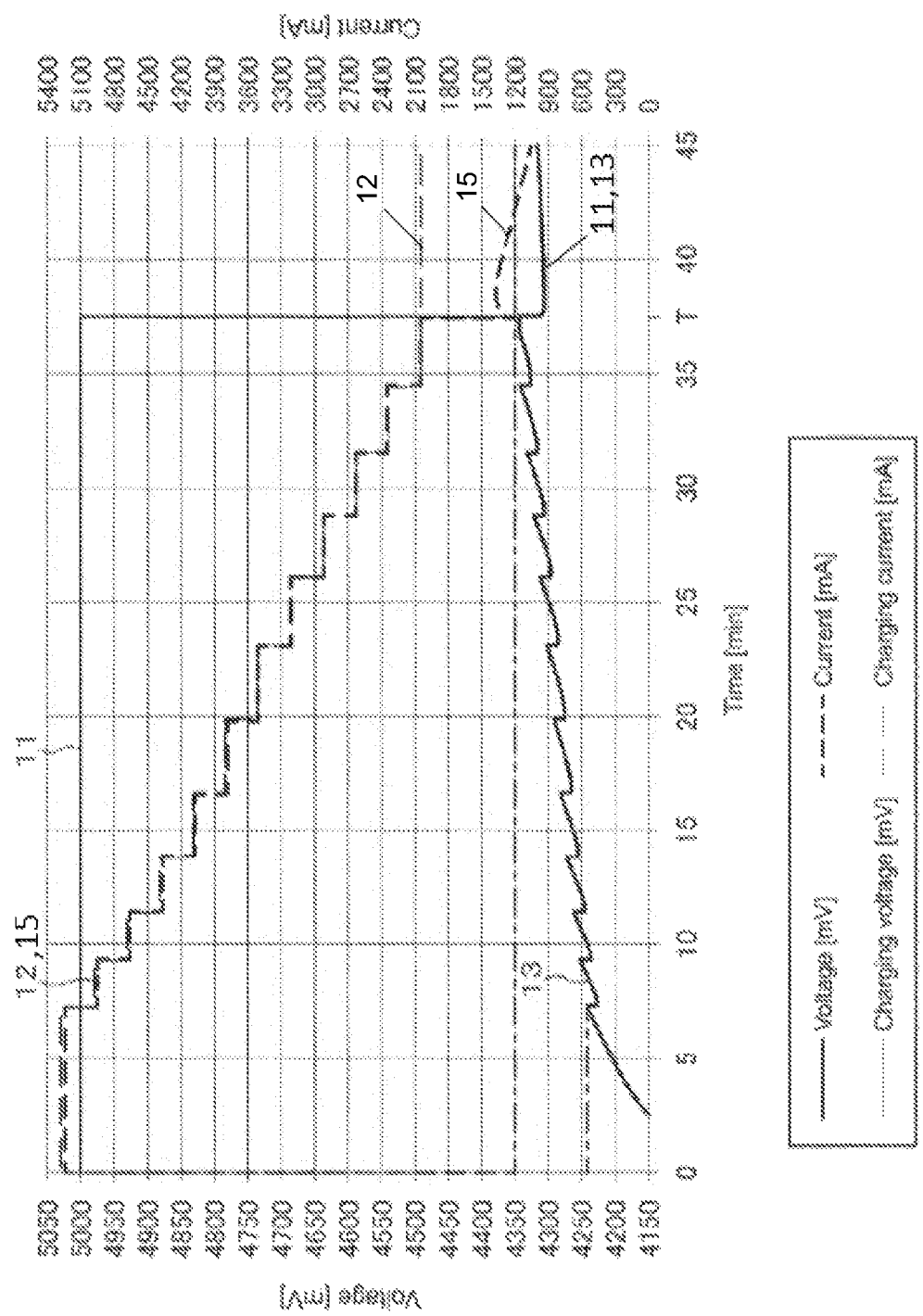
FIG. 4 is a graph enlarging a part of the graph of the charging control.

Further, FIG. 4 is a graph showing each of the charging voltage (reference sign 11), the charging current (reference sign 12), and the battery voltage (reference sign 13) until the time T in an enlarged state. One vertical axis represents voltage (mV), and the other vertical axis represents current (mA). FIG. 4 shows each of the prescribed charging voltage 4350 (mV) (dashed line) and initial threshold voltage 4240 (mV) (dashed line).

First, the charging voltage is set to 5000 (mV) (reference sign 11), and the charging current is set to 5274 (mA) (reference sign 12). When the battery voltage is rapidly increased and exceeds the threshold voltage, the charging current is decreased by 0.1 ItA (for example, 293 (mA)). When the charging current is decreased, the battery voltage is temporary decreased. When the voltage is again increased and exceeds the next threshold voltage (4240 (mV)+10 (mV)=4250 (mV)), the charging current is decreased by 0.1 ItA.

At the time T at which the charging current exceeds 0.7 ItA (2051 (mA)) and the voltage exceeds the prescribed charging voltage (4350 (mV)), the rapid charging is switched to the constant current/constant voltage charging. Note that the charging current and the current (reference sign 15) are similarly changed until the time T. After the time T, the charging current is uniform, but the current is temporarily increased and is then gradually decreased.

As the charging proceeds, the SOC (reference sign 14) is increased. As shown in FIG. 3 and FIG. 4, it is possible to charge by about 41% after 15 minutes, by about 71% after 30 minutes, and by about 93% after 60 minutes from the start of the charging.

According to the embodiment of the present disclosure described above, the charging current is step-by-step decreased from 1.8 ItA to 0.7 ItA by 0.1 ItA step. From the relationship, the number of steps for decreasing the charging current is determined. Specifically, (1.8−0.7)/0.1=11 (steps). Further, the initial voltage change is (4350 (mV)−4240 (mV)=110 (mV)), which results in 110 (mV)/11=10 (mV). Therefore, the unit of increasing the threshold voltage is set to 10 (mV).

Effect of the Present Disclosure

As can be seen from the graph of FIG. 4, the threshold voltage is set to the range lower than the prescribed charging voltage (4350 (mV)) during the period of the large current charging according to the embodiment of the present disclosure. Experiments or the like of the inventors of the present disclosure revealed that the capacity degradation during the course of cycling relates to a high voltage time of the secondary battery as well as to the large current charging at the high voltage. Therefore, in the control where the charging current is gradually decreased, the threshold voltage A is set low upon the large current charging for the first time, and the threshold voltage A is gradually increased along with the decrease in the charging current. The control enables the target rapid charging and the suppression of the capacity degradation at the same time.

Figure 5:
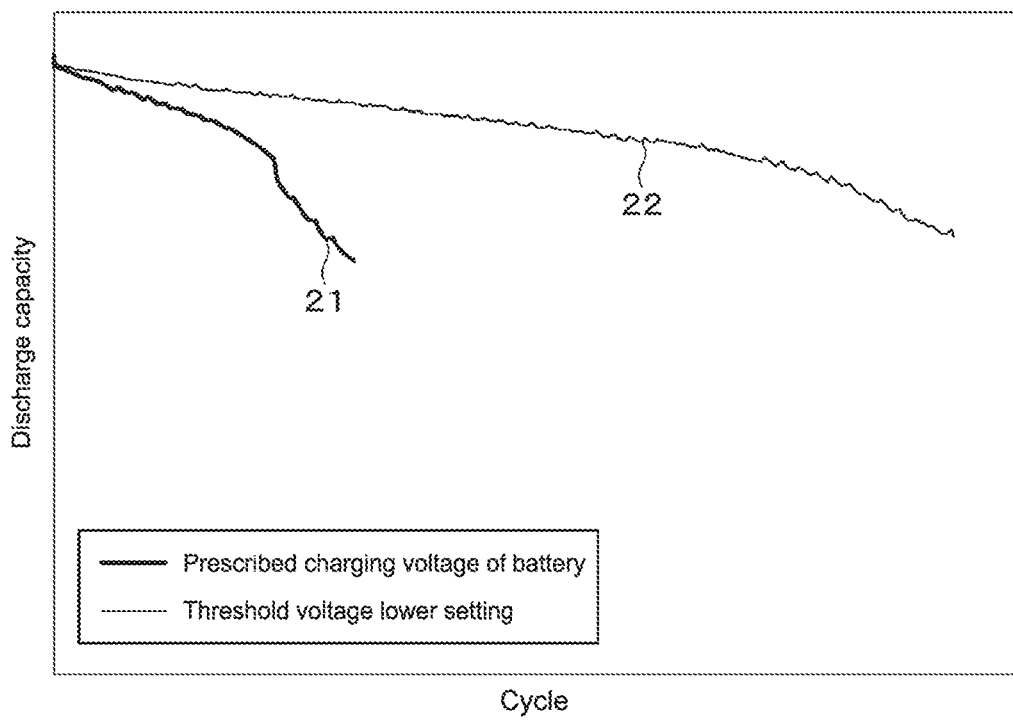
FIG. 5 is a graph showing cycle characteristics in a case where threshold voltage is set lower than prescribed charging voltage.

FIG. 5 shows cycle characteristics. A cycle characteristic 21 is obtained by setting the threshold voltage A to the prescribed charging voltage of the secondary battery when the charging current is decreased, and a cycle characteristic 22 is obtained by setting the same lower than the prescribed charging voltage. Comparing the cycle characteristics 21 and 22 reveals that there is a great difference between the capacities during the course of cycling. By the method of decreasing the charging current after the prescribed charging voltage is detected, the state close to the prescribed charging voltage lasts long, which causes a problem that a discharge capacity is greatly decreased.

2. Modification Examples

By referring to a variety of measurement data of a secondary voltage (number of cycles, total operation time, high voltage exposure time, high temperature exposure time, charging and discharging time, capacity value, impedance, and the like), it is determined that the measurement data has the value greater than the set value. In this case, it is decided that the capacity degradation proceeds. As a result, the charging parameters are varied.

As the charging parameters to be varied, the charging voltage and the threshold voltage A are set to have the respective values lower than the prescribed charging voltage of the secondary battery by 10 (mV), for example, when the charging current is decreased to the nominal capacity, 0.7 ItA, by the rapid charging. Also, taking into consideration an internal resistance increase during the course of cycling, the current value at the time of starting the charging set for the rapid charging is also set to the value decreased by 0.1 ItA. By the control, a plurality of setting values are prepared for each step. For example, the charging voltage, the threshold voltage A, and the charging current can be decreased every time the number of cycles is increased by a certain value. By the control of varying the charging parameters, it is possible to suppress the degradation for a longer time.

Figure 6:
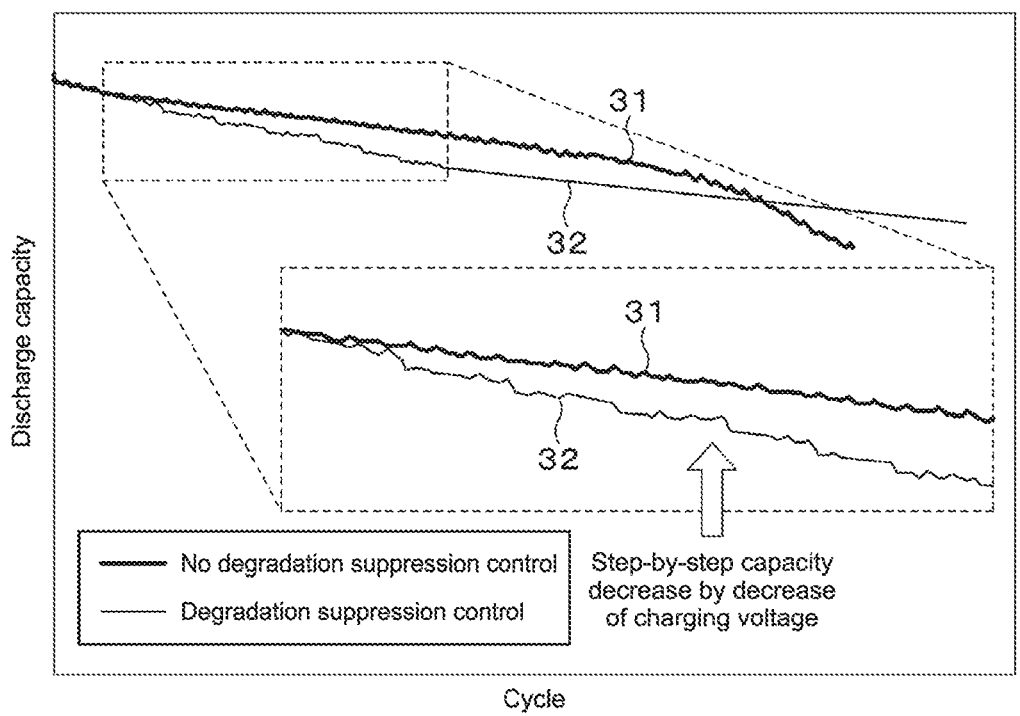
FIG. 6 is a graph showing a difference between cycle characteristics with degradation suppression control and without degradation suppression control.

FIG. 6 is a graph showing the results of cycle tests for two types of the secondary batteries. One type of the secondary battery adopts the control that the charging voltage at the constant current/constant voltage charging after the rapid charging and the threshold voltage A during the transition from the rapid charging are each decreased by 10 (mV) in accordance with the number of cycles. The other type of the secondary battery is charged to the prescribed charging voltage. In the short run, since the charging voltage is decreased by 10 (mV) every time the cycle proceeds, the capacity of the controlled secondary battery is more decreased. However, the voltage during charging does not exceed the prescribed charging voltage. Therefore, in the long run, the capacity of the controlled secondary battery can be suppressed from decreasing as compared with the secondary battery charged to the prescribed charging voltage.

An environment temperature also largely affects the decrease in the capacity of the secondary voltage. According to the present disclosure, the rapid charging may be performed only when the temperature of the secondary battery measured at the time of starting charging is within the normal temperature range. Further, the charging current and/or the charging voltage may be changed on the basis of whether the environment temperature is in a low temperature range or a high temperature range.

Figure 7:
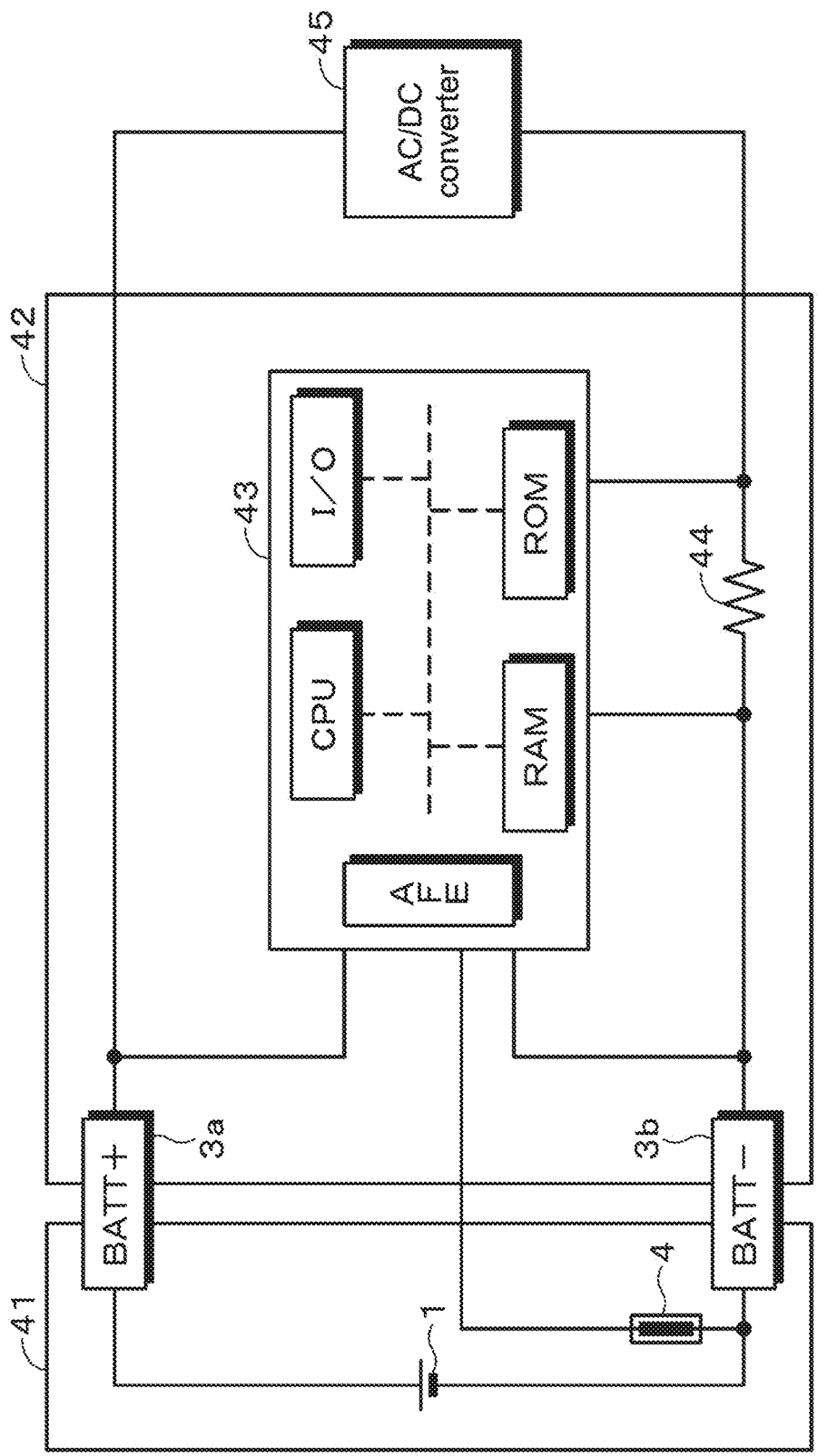
FIG. 7 is a block diagram of a first modification example of the present disclosure.

The above-described embodiment is an example where the present disclosure is applied to the battery pack. However, as shown in FIG. 7, charging may be controlled at an electronic device side. A battery pack 41 includes the battery cell 1 and the thermistor 4. An electronic device 42 includes the controller 43 and the current detection resistor 44. A DC power supply formed by an AC/DC converter 45 is used as a charging power source. The controller 43 of the electronic device 42 performs the control similarly to the controller 2 of the above-described embodiment (see flowchart of FIG. 2). The configuration can also provide the similar effects.

Figure 8:
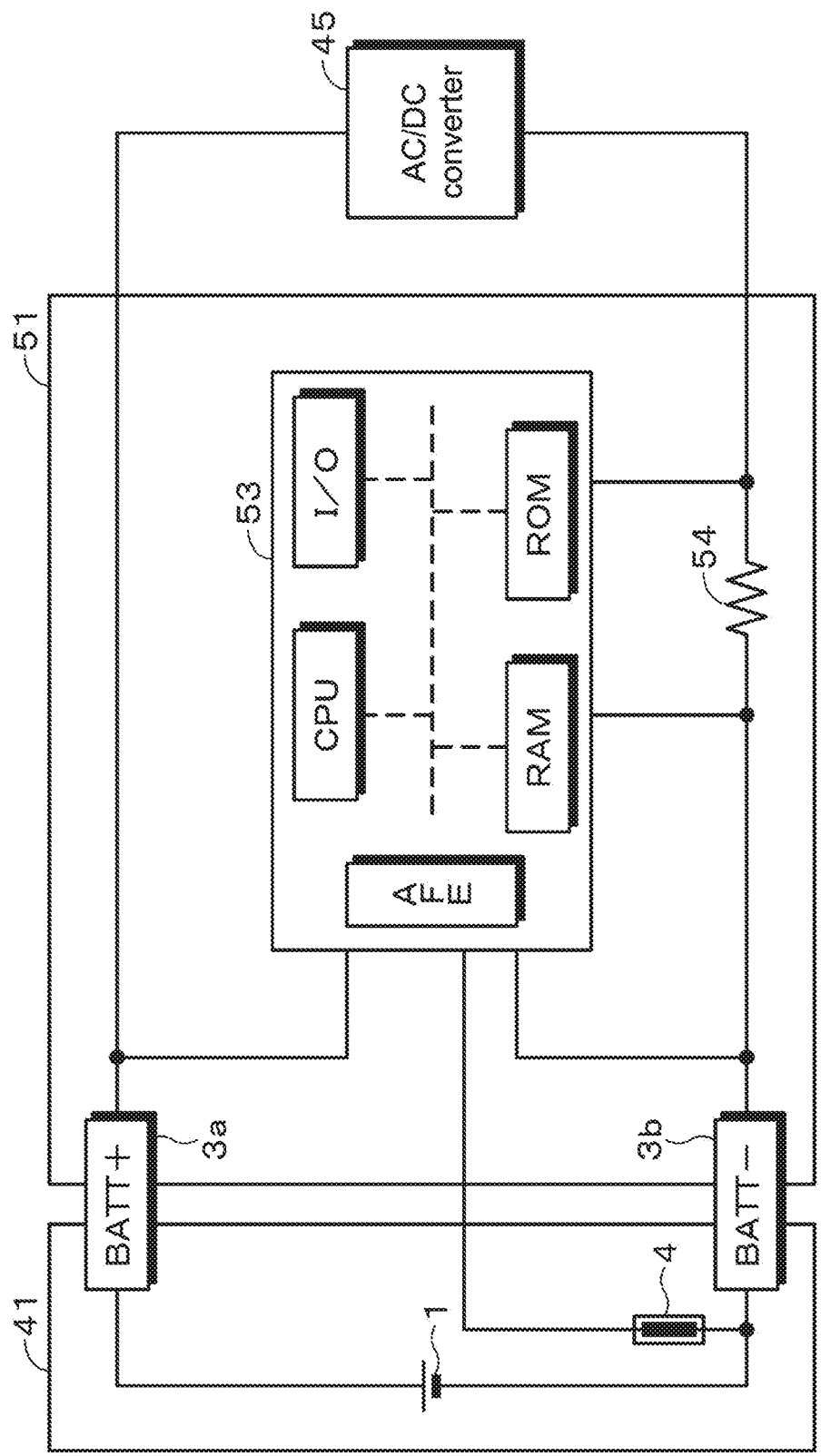
FIG. 8 is a block diagram of a second modification example of the present disclosure.

As shown in FIG. 8, the control can be performed at a charging apparatus 51 side that charges the battery pack 41. The charging apparatus 51 includes a controller 53 and a current detection resistor 54, and performs the control similarly to the controller 2 of the above-described embodiment (see flowchart of FIG. 2). The configuration can also provide the similar effects.

Figure 9:
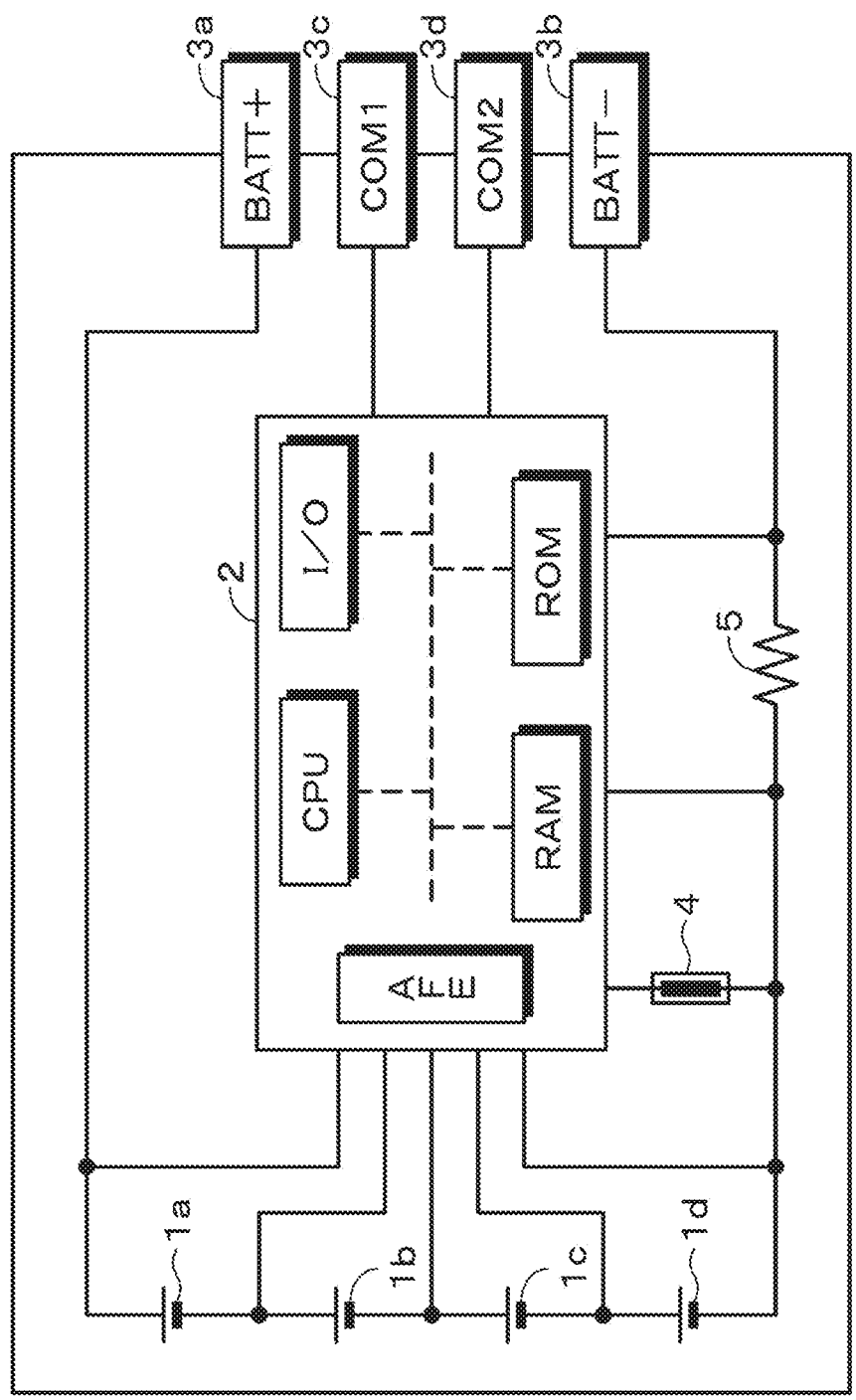
FIG. 9 is a block diagram of a third modification example of the present disclosure.

The above-described embodiment is an example where the present disclosure is applied to the battery pack including one battery cell 1. However, as shown in FIG. 9, the present disclosure can be similarly applied to a battery pack including a battery where a plurality of, for example, four battery cells 1a, 1b, 1c, and 1d are connected in series, which can provide the similar effects.

The present disclosure may also have the following configurations.

(1) A battery apparatus, including:
 a secondary battery;
 a measurement portion that measures voltage and current of the secondary battery; and
 a controller, to which measured voltage and measured current are supplied from the measurement portion, that controls charging voltage and charging current of the secondary battery,
  the controller performing control to
  set a current value exceeding a nominal capacity of the secondary battery to a first charging current to charge the secondary battery,
  compare the measured voltage of the secondary battery with first threshold voltage that is lower than a prescribed charging voltage while performing constant current charging with the set first charging current,
  decrease the first charging current to be second charging current when the measured voltage is higher than the first threshold voltage, and increase the first threshold voltage by a predetermined amount to be second threshold voltage,
  compare the measured voltage of the secondary battery with the second threshold voltage that is lower than the prescribed charging voltage while performing constant current charging with the set second charging current,
  decrease the second charging current to be third charging current when the measured voltage is higher than the second threshold voltage, and increase the second threshold voltage by a predetermined amount to be third threshold voltage, and
  repeat a comparison of the measured voltage with the threshold voltage and a change of the charging current and the threshold voltage, and complete rapid charging in a case where $n^{th}$ charging current is decreased to a predetermined value and the measured voltage is higher than the predetermined value.

(2) The battery apparatus according to (1), in which
 the predetermined value that is compared with the $n^{th}$ charging current is a value when the rapid charging is switched to constant voltage charging.

(3) The battery apparatus according to (1) or (2), in which
 the predetermined value that is compared with the measured voltage is charging voltage.

(4) The battery apparatus according to any one of (1) to (3), in which
 the charging voltage is set to a voltage higher than the prescribed charging voltage of the secondary battery.

[5] The battery apparatus according to any one of (1) to (4), in which
 the controller performs control to perform constant current/constant voltage charging after the rapid charging is completed.

[6] The battery apparatus according to any one of (1) to (5), in which
 a charging parameter is varied depending on a degradation state of the secondary battery.

(7) A charging control apparatus, to which measured voltage and measured current are supplied from a secondary battery to be charged, that controls charging voltage and charging current of the secondary battery,
  the controller performing control to
  set a current value exceeding a nominal capacity of the secondary battery to first charging current to charge the secondary battery, compare the measured voltage of the secondary battery with first threshold voltage that is lower than a prescribed charging voltage while performing constant current charging with the set first charging current, decrease the first charging current to be second charging current when the measured voltage is higher than the first threshold voltage, and increase the first threshold voltage by a predetermined amount to be second threshold voltage, compare the measured voltage of the secondary battery with the second threshold voltage that is lower than the prescribed charging voltage while performing constant current charging with the set second charging current, decrease the second charging current to be third charging current when the measured voltage is higher than the second threshold voltage, and increase the second threshold voltage by a predetermined amount to be third threshold voltage, repeat a comparison of the measured voltage with the threshold voltage and a change of the charging current and a change of the threshold voltage, and complete rapid charging in a case where $n^{th}$ charging current is decreased to a predetermined value and the measured voltage is higher than the predetermined value.

(8) The charging control apparatus according to (7), in which the charging voltage is set to a voltage higher than the prescribed charging voltage of the secondary battery.

(9) The charging control apparatus according to (7) or (8), in which the charging control apparatus performs control to perform constant current/constant voltage charging after the rapid charging is completed.

(10) The charging control apparatus according to any one of (7) to (9), in which a charging parameter is varied depending on a degradation state of the secondary battery.

(11) A charging control method that receives measured voltage and measured current of a secondary battery to be charged and controls charging voltage and charging current of the secondary battery, comprising performing control to set a current value exceeding a nominal capacity to first charging current in order to charge the secondary battery, compare the measured voltage of the secondary battery with first threshold voltage that is lower than a prescribed charging voltage while performing constant current charging with the set first charging current, decrease the first charging current to be second charging current when the measured voltage is higher than the first threshold voltage, and increase the first threshold voltage by a predetermined amount to be second threshold voltage, compare the measured voltage of the secondary battery with the second threshold voltage that is lower than the prescribed charging voltage while performing constant current charging with the set second charging current, decrease the second charging current to be third charging current when the measured voltage is higher than the second threshold voltage, and increase the second threshold voltage by a predetermined amount to be third threshold voltage, repeat a comparison of the measured voltage with the threshold voltage and a change of the charging current and the threshold voltage, and complete rapid charging in a case where $n^{th}$ charging current is decreased to a predetermined value and the measured voltage is higher than the predetermined value.

Modification Example

As described above, the embodiments of the present disclosure have been described in detail, but are not limited thereto. Various modifications and alterations of the present disclosure may be available on the basis of the technical spirit of the present disclosure. For example, the configurations, the methods, the processes, the shapes, the materials, the numerical values and the like described in the above-described embodiments are only illustrative, and configurations, methods, processes, shapes, materials, numerical values and the like that are different therefrom may be used as necessary.

In addition, the configurations, the methods, the processes, the shapes, the materials, the numerical values and the like described in the above-described embodiments can be combined each other without departing from the gist of the present disclosure.

REFERENCE SIGNS LIST 1, 1a to 1d battery cell
2, 43, 53 controller
5, 44, 54 current detection resistor

The invention claimed is:
1. A battery apparatus, comprising:
a secondary battery;
a measurement circuit that measures a voltage and a current of the secondary battery; and
a controller, to which the measured voltage and the measured current are supplied from the measurement circuit, that controls a charging voltage and a charging current of the secondary battery, the controller configured to:
set a current value, exceeding a nominal value, as a first charging current to charge the secondary battery;
compare the measured voltage of the secondary battery with a first threshold voltage lower than a prescribed charging voltage, while performing first constant current charging with the set first charging current;
decrease the first charging current to obtain a second charging current when the measured voltage is higher than the first threshold voltage, and increase the first threshold voltage by a first predetermined amount to obtain a second threshold voltage;
compare the measured voltage of the secondary battery with the second threshold voltage lower than the prescribed charging voltage while performing second constant current charging with the second charging current;
decrease the second charging current to obtain a third charging current when the measured voltage is higher than the second threshold voltage, and increase the second threshold voltage by a second predetermined amount to obtain a third threshold voltage;
complete rapid charging in a case where the third charging current is decreased to a first predetermined value and the measured voltage is higher than a second predetermined value;
determine a degradation degree of the secondary battery after the completion of the rapid charging;
set a first value of the charging voltage for constant voltage charging based on the determined degradation degree; and switch the rapid charging to the constant voltage charging based on the set first charging voltage for the constant voltage charging,
  wherein the first predetermined value is a value of the charging current when the rapid charging is switched to the constant voltage charging, and
  wherein the first value of the charging voltage at the constant voltage charging after the completion of the rapid charging and the second predetermined value are varied based on a number of cycles of the secondary battery.

2. The battery apparatus according to claim 1, wherein the second predetermined value is a second value of the charging voltage when the rapid charging is switched to the constant voltage charging.

3. The battery apparatus according to claim 1, wherein the controller is further configured to set a second charging voltage higher than the prescribed charging voltage of the secondary battery for the rapid charging.

4. The battery apparatus according to claim 1, wherein the controller is further configured to perform one of third constant current charging or the constant voltage charging after the rapid charging is completed.

5. The battery apparatus according to claim 1, wherein a charging parameter is varied based on the degradation degree of the secondary battery.

6. A charging control apparatus, to which a measured voltage and a measured current are supplied from a secondary battery to be charged, that controls a charging voltage and a charging current of the secondary battery, comprising:
  a controller configured to
  set a current value, exceeding a nominal value, as a first charging current to charge the secondary battery;
  compare the measured voltage of the secondary battery with a first threshold voltage lower than a prescribed charging voltage, while performing first constant current charging with the set first charging current;
  decrease the first charging current to obtain a second charging current when the measured voltage is higher than the first threshold voltage, and increase the first threshold voltage by a first predetermined amount to obtain a second threshold voltage;
  compare the measured voltage of the secondary battery with the second threshold voltage lower than the prescribed charging voltage while performing second constant current charging with the second charging current;
  decrease the second charging current to obtain a third charging current when the measured voltage is higher than the second threshold voltage, and increase the second threshold voltage by a second predetermined amount to obtain a third threshold voltage;
  complete rapid charging in a case where the third charging current is decreased to a first predetermined value and the measured voltage is higher than a second predetermined value;
  determine a degradation degree of the secondary battery after the completion of the rapid charging;
  set a first value of the charging voltage for constant voltage charging based on the determined degradation degree; and
  switch the rapid charging to the constant voltage charging based on the set first charging voltage for the constant voltage charging,
    wherein the first predetermined value is a value of the charging current when the rapid charging is switched to the constant voltage charging, and
    wherein the first value of the charging voltage at the constant voltage charging after the completion of the rapid charging and the second predetermined value are varied based on a number of cycles of the secondary battery.

7. The charging control apparatus according to claim 6, wherein
  the controller is further configured to set a second charging voltage higher than the prescribed charging voltage of the secondary battery for the rapid charging.

8. The charging control apparatus according to claim 6, wherein
  the controller is further configured to perform one of third constant current charging or the constant voltage charging after the rapid charging is completed.

9. The charging control apparatus according to claim 6, wherein
  a charging parameter is varied based on the degradation degree of the secondary battery.

10. A charging control method that receives a measured voltage and a measured current of a secondary battery to be charged and controls a charging voltage and a charging current of the secondary battery, comprising
  setting a current value, exceeding a nominal value, as a first charging current to charge the secondary battery;
  comparing the measured voltage of the secondary battery with a first threshold voltage lower than a prescribed charging voltage, while performing first constant current charging with the set first charging current;
  decreasing the first charging current to obtain a second charging current when the measured voltage is higher than the first threshold voltage, and increase the first threshold voltage by a first predetermined amount to obtain a second threshold voltage;
  comparing the measured voltage of the secondary battery with the second threshold voltage lower than the prescribed charging voltage while performing second constant current charging with the second charging current;
  decreasing the second charging current to obtain a third charging current when the measured voltage is higher than the second threshold voltage, and increase the second threshold voltage by a second predetermined amount to obtain a third threshold voltage;
  completing rapid charging in a case where the third charging current is decreased to a first predetermined value and the measured voltage is higher than a second predetermined value;
  determining a degradation degree of the secondary battery after the completion of the rapid charging;
  setting a first value of the charging voltage for constant voltage charging based on the determined degradation degree; and
  switching the rapid charging to the constant voltage charging based on the set charging voltage for the constant voltage charging,
    wherein the first predetermined value is a value of the charging current when the rapid charging is switched to the constant voltage charging, and
    wherein the first value of the charging voltage at the constant voltage charging after the completion of the rapid charging and the second predetermined value are varied based on a number of cycles of the secondary battery.

* * * * *